(12) United States Patent
Chu et al.

(10) Patent No.: US 9,831,211 B2
(45) Date of Patent: Nov. 28, 2017

(54) ANISOTROPIC CONDUCTIVE MATERIAL, ELECTRONIC DEVICE INCLUDING ANISOTROPIC CONDUCTIVE MATERIAL, AND METHOD OF MANUFACTURING ELECTRONIC DEVICE

(71) Applicant: Samsung Electronics Co., Ltd., Suwon-si, Gyeonggi-do (KR)

(72) Inventors: Kunmo Chu, Seoul (KR); Wonsuk Chang, Hwaseong-si (KR); Chanmoon Chung, Wonju-si (KR)

(73) Assignees: Samsung Electronics Co., Ltd., Gyeonggi-do (KR); Yonsei University Wonju Industry-Academic Cooperation Foundation, Gangwon-do (KR)

( * ) Notice: Subject to any disclaimer, the term of this patent is extended or adjusted under 35 U.S.C. 154(b) by 0 days.

(21) Appl. No.: 15/015,758

(22) Filed: Feb. 4, 2016

(65) Prior Publication Data

US 2017/0062374 A1 Mar. 2, 2017

(30) Foreign Application Priority Data

Aug. 31, 2015 (KR) ........................ 10-2015-0123207

(51) Int. Cl.
*H01L 23/52* (2006.01)
*H01L 23/00* (2006.01)
(Continued)

(52) U.S. Cl.
CPC .............. *H01L 24/33* (2013.01); *H01B 1/22* (2013.01); *H01L 23/5328* (2013.01);
(Continued)

(58) Field of Classification Search
CPC .......... H01L 23/53276; H01L 23/5328; H01L 2224/29198; H01L 2224/293;
(Continued)

(56) References Cited

U.S. PATENT DOCUMENTS 5,445,308 A * 8/1995 Nelson ....................... C09J 9/02
228/121
6,339,120 B1 1/2002 Misra et al.
(Continued)

FOREIGN PATENT DOCUMENTS

EP 1143512 A2 10/2001
JP 08311420 A 11/1996
(Continued)

OTHER PUBLICATIONS

Extended European Search Report dated Feb. 15, 2017 issued in corresponding European Patent Application No. 16167463.5.

*Primary Examiner* — Matthew E Warren
(74) *Attorney, Agent, or Firm* — Harness, Dickey & Pierce, P.L.C.

(57) ABSTRACT

Provided are anisotropic conductive materials, electronic devices including anisotropic conductive materials, and/or methods of manufacturing the electronic devices. An anisotropic conductive material may include a plurality of particles in a matrix material layer. At least some of the particles may include a core portion and a shell portion covering the core portion. The core portion may include a conductive material that is in a liquid state at a temperature greater than 15° C. and less than or equal to about 110° C. or less. For example, the core portion may include at least one of a liquid metal, a low melting point solder, and a nanofiller. The shell portion may include an insulating material. A bonding portion formed by using the anisotropic conductive material (Continued)

may include the core portion outflowed from the particle and may further include an intermetallic compound.

30 Claims, 31 Drawing Sheets

(51) Int. Cl.
*H01L 23/532* (2006.01)
*H01B 1/22* (2006.01)
*H01R 4/04* (2006.01)
*H01R 13/24* (2006.01)

(52) U.S. Cl.
CPC ........ *H01L 23/53276* (2013.01); *H01L 24/09* (2013.01); *H01L 24/29* (2013.01); *H01R 4/04* (2013.01); *H01L 2224/29028* (2013.01); *H01L 2224/2949* (2013.01); *H01L 2224/2957* (2013.01); *H01L 2224/29105* (2013.01); *H01L 2224/29198* (2013.01); *H01L 2224/29393* (2013.01); *H01L 2224/29394* (2013.01); *H01L 2224/29691* (2013.01); *H01L 2224/32227* (2013.01); *H01L 2924/01006* (2013.01); *H01L 2924/0132* (2013.01); *H01L 2924/0133* (2013.01); *H01L 2924/0134* (2013.01); *H01L 2924/1426* (2013.01); *H01R 13/2414* (2013.01)

(58) Field of Classification Search
CPC . H01L 2224/29393; H01L 2224/29394; H01L 2224/2949

USPC .......................................... 257/738, 741, 746
See application file for complete search history.

(56) References Cited

U.S. PATENT DOCUMENTS

| | | | |
|---|---|---|---|
| 6,624,224 | B1 | 9/2003 | Misra |
| 7,635,862 | B2* | 12/2009 | Takano .................... C09J 9/02 257/13 |
| 2004/0234763 | A1* | 11/2004 | Saito ...................... C08G 59/18 428/402.2 |
| 2005/0228097 | A1 | 10/2005 | Zhong |
| 2007/0063347 | A1* | 3/2007 | Su .......................... H01L 24/29 257/741 |
| 2010/0090176 | A1 | 4/2010 | Kosowsky et al. |
| 2010/0247892 | A1 | 9/2010 | Lee et al. |
| 2014/0168919 | A1 | 6/2014 | Ishimatsu |
| 2014/0170381 | A1 | 6/2014 | He et al. |
| 2014/0355226 | A1 | 12/2014 | Kim et al. |
| 2015/0091192 | A1 | 4/2015 | Shin et al. |
| 2015/0098036 | A1 | 4/2015 | Saitou |
| 2015/0129276 | A1 | 5/2015 | Shumaker et al. |
| 2015/0129808 | A1 | 5/2015 | Mrozek et al. |

FOREIGN PATENT DOCUMENTS

| | | |
|---|---|---|
| JP | 2007165028 A | 6/2007 |
| KR | 20100127575 A | 12/2010 |
| KR | 20120111698 A | 10/2012 |
| KR | 20140078557 A | 6/2014 |
| WO | WO-2005/096320 A2 | 10/2005 |

* cited by examiner

ANISOTROPIC CONDUCTIVE MATERIAL, ELECTRONIC DEVICE INCLUDING ANISOTROPIC CONDUCTIVE MATERIAL, AND METHOD OF MANUFACTURING ELECTRONIC DEVICE

CROSS-REFERENCE TO RELATED APPLICATION

This application claims priority under 35 U.S.C. §119 to Korean Patent Application No. 10-2015-0123207, filed on Aug. 31, 2015, in the Korean Intellectual Property Office, the disclosure of which is incorporated herein in its entirety by reference.

BACKGROUND

1. Field

The present disclosure relates to anisotropic conductive materials, electronic devices including anisotropic conductive materials, and/or methods of manufacturing the electronic devices.

2. Description of Related Art

An anisotropic conductive film (ACF) is a material that may provide an electrical connection in a vertical direction (a Z-axis direction) in which electrodes face each other, while maintaining insulation in a horizontal direction (a direction parallel to an XY plane). The ACF may implement an adhering function, an electrical connection function, and an insulating function simultaneously.

For example, the ACF is used as a material for mounting a chip or a package on a substrate to manufacture a display device such as a liquid crystal display (LCD). Mounting methods such as chip-on-glass (COG) and chip-on-film (COF) are used to manufacture display devices, and the ACF is used as a principal material in both the COG and COF methods. However, as an integration degree of devices increases and a distance (e.g., pitch) between electrodes decreases, when forming electrical connection with the ACF, a desired electrical connection may not be formed or a connection in an undesired direction (e.g., a short) may occur. Also, when a connecting/adhering process is performed at relatively high temperatures or pressures, the substrate may be deformed or the chip may be damaged and the bonding alignment thereof may be distorted.

SUMMARY

Provided are anisotropic conductive materials (ACMs) that may ensure excellent electrical connection characteristics.

Provided are anisotropic conductive materials that may reduce an error rate and improve reliability.

Provided are anisotropic conductive materials that may be easily applied to mount devices (e.g., semiconductor chips) having a fine pitch between electrodes.

Provided are anisotropic conductive materials that may improve connecting/adhering process conditions.

Provided are anisotropic conductive materials that may perform a connecting/adhering process at relatively low temperatures and/or relatively low pressures.

Provided are anisotropic conductive materials having a self-healing function.

Provided are electronic devices (electronic apparatuses) to which the above anisotropic conductive materials are applied.

Provided are methods of manufacturing electronic devices (electronic apparatuses) by using the above anisotropic conductive materials.

Additional aspects will be set forth in part in the description which follows and, in part, will be apparent from the description, or may be learned by practice of the example embodiments.

According to example embodiments, an anisotropic conductive material includes a matrix material layer and a plurality of particles in the matrix material layer. At least some of the particles have a capsule structure including a conductive core portion and an insulating shell portion. The conductive core portion includes a conductive material that is in a liquid state at a temperature or a temperature greater than about 15° C. and less than or equal to about 110° C.

In example embodiments, the conductive material may include a liquid metal.

In example embodiments, the liquid metal may include at least one of gallium (Ga), a gallium-indium (Ga—In) alloy, a gallium-indium-tin (Ga—In—Sn) alloy, and a gallium-indium-tin-zinc (Ga—In—Sn—Zn) alloy.

In example embodiments, the conductive material may further include nanofillers contained in the liquid metal.

In example embodiments, the conductive material may include a suspension containing nanofillers.

In example embodiments, the nanofillers may include at least one of a carbon nanotube (CNT), a carbon nanofiber (CNF), a carbon black, a fullerene, a graphene flake, a graphene particle, a metal nanowire, and a metal nanoparticle.

In example embodiments, the conductive material may include a solder having a melting point of about 110° C. or less.

In example embodiments, the solder may include at least one of a bismuth-indium (Bi—In)-based alloy, a bismuth-tin (Bi—Sn)-based alloy, an indium-bismuth (In—Bi)-based alloy, a bismuth-indium-tin (Bi—In—Sn)-based alloy, an indium-bismuth-tin (In—Bi—Sn)-based alloy, and an indium-tin-zinc (In—Sn—Zn)-based alloy.

In example embodiments, the insulating shell portion may include a polymer or a ceramic.

In example embodiments, the polymer may have an elastic modulus of about 0.3 GN/m$^2$ to about 35 GN/m$^2$.

In example embodiments, the insulating shell portion may have a thickness of about 30 nm to about 200 nm.

In example embodiments, the particles may have a diameter of about 1 μm to about 100 μm.

In example embodiments, the anisotropic conductive material may further include at least one self-healing capsule in the matrix material layer.

In example embodiments, the self-healing capsule may include an underfill material. The underfill material may be in a core portion thereof of the self-healing capsule.

According to example embodiments, an electronic device includes the above-described anisotropic conductive material, a first member, a second member, and a structure electrically connecting the first member to the second member using the anisotropic conductive material.

According to example embodiments, an electronic device includes a first member including at least one first electrode portion, a second member including at least one second electrode portion, and an anisotropic conductive material between the first member and the second member. The second member faces the first member. The anisotropic conductive material electrically connects the first electrode portion to the second electrode portion. The anisotropic conductive material includes a plurality of particles in a matrix material layer. The particles include a conductive core portion and an insulating shell portion. The conductive core portion includes a conductive material that is in a liquid state at a temperature greater than about 15° C. and less than or equal to about 110° C. The insulating shell portion of at least one of the particles is broken between the first electrode portion and the second electrode portion such that the first electrode portion and the second electrode portion are electrically connected by the core portion outflowed to an outside of the broken shell portion.

In example embodiments, the conductive material may include a liquid metal.

In example embodiments, the conductive material may further include nanofillers contained in the liquid metal.

In example embodiments, the conductive material may include a suspension containing nanofillers.

In example embodiments, the nanofillers may include at least one of a carbon nanotube (CNT), a carbon nanofiber (CNF), a carbon black, a fullerene, a graphene flake, a graphene particle, a metal nanowire, and a metal nanoparticle.

In example embodiments, the conductive material may include a solder having a melting point of about 110° C. or less.

In example embodiments, the electronic device may further include an intermetallic compound. The intermetallic compound may be between at least one of the first electrode portion and the outflowed core portion and the second electrode portion and the outflowed core portion.

In example embodiments, the insulating shell portion may include a polymer or a ceramic.

In example embodiments, the polymer may have an elastic modulus of about 0.3 GN/m$^2$ to about 35 GN/m$^2$.

In example embodiments, the insulating shell portion may have a thickness of about 30 nm to about 200 nm.

In example embodiments, the particles may have a diameter of about 1 μm to about 100 μm.

In example embodiments, the anisotropic conductive material may further include at least one self-healing capsule.

In example embodiments, the first member may include a substrate, and the second member may include a semiconductor chip.

In example embodiments, the first member may include a substrate or a panel, and the second member may include a driver integrated circuit (IC) or a driver IC package.

In example embodiments, the electronic device may include, for example, a display device.

According to example embodiments, an electronic device includes a first member including at least one first electrode portion, a second member including at least one second electrode portion, and an anisotropic conductive material between the first member and the second member. The second member faces the first member. The anisotropic conductive material electrically connects the first electrode portion to the second electrode portion. The anisotropic conductive material includes a metallic material between the first electrode portion and the second electrode portion, and an intermetallic compound between the metallic material and at least one of the first electrode portion and the second electrode portion.

In example embodiments, the anisotropic conductive material may include a plurality of particles in a matrix material layer. The particles may include a conductive core portion and an insulating shell portion. The core portion may include a conductive material that is in a liquid state at a temperature greater than about 15° C. and less than or equal to about 110° C.

In example embodiments, the insulating shell portion of at least one of the particles may be broken between the first electrode portion and the second electrode portion such that the first electrode portion and the second electrode portion may be electrically connected by the core portion outflowed to an outside of the broken shell portion. The outflowed core portion may include the metallic material, and the intermetallic compound may be between the outflowed core portion and at least one of the first electrode portion and the second electrode portion.

In example embodiments, the metallic material may include at least one of a liquid metal, a metallic nanofiller, and a solder having a melting point of about 110° C. or less.

According to example embodiments, a method of manufacturing an electronic device includes: preparing a first member including at least one first electrode portion; preparing a second member including at least one second electrode portion; providing an anisotropic conductive material between the first member and the second member, and pressing the first member and the second member with the anisotropic conductive material therebetween to electrically connect the first electrode portion and the second electrode portion. The anisotropic conductive material includes a plurality of particles in a matrix material layer. The particles have a conductive core portion and an insulating shell portion. The conductive core portion includes a conductive material that is in a liquid state at a temperature greater than 15° C. and less than or equal to about 110° C.

In example embodiments, the electrical connecting of the first electrode portion and the second electrode portion may include breaking the insulating shell portion of at least one of the particles, which is located between the first electrode portion and the second electrode portion, to outflow the conductive core portion to an outside thereof.

In example embodiments, the electrical connecting of the first electrode portion and the second electrode portion may further include forming an intermetallic compound by a reaction between the outflowed core portion and at least one of the first electrode portion and the second electrode portion.

In example embodiments, the electrical connecting of the first electrode portion and the second electrode portion may be performed at a temperature of about 110° C. or less.

In example embodiments, the electrical connecting of the first electrode portion and the second electrode portion may be performed by using a pressure of less than about 30 MPa.

In example embodiments, the conductive material may include a liquid metal.

In example embodiments, the conductive material may further include nanofillers contained in the liquid metal.

In example embodiments, the conductive material may include a suspension containing nanofillers.

In example embodiments, the conductive material may include a solder having a melting point of about 110° C. or less.

According to example embodiments, an anisotropic conductive material includes a matrix material layer and a plurality of capsules dispersed in the matrix material layer. The capsules include a core portion and an insulating shell portion. The core portion includes one of an underfill material and a conductive material. The conductive material has a melting point in a range that is greater than or equal to about 15° C. and less than or equal to about 110° C.

In example embodiments, the one of the underfill material and the conductive material may be the underfill material. The underfill material may include at least one of a thermosetting resin, a thermoplastic resin, and a UV-curable resin.

In example embodiments, the one of the underfill material and the conductive material may be the conductive material. The conductive material may include a liquid metal.

In example embodiments, the core portion may further include conductive nanofillers dispersed in the liquid metal.

In example embodiments, an electronic device may include a first member including a first electrode portion, a second member on the first member, and the above-described anisotropic conductive material between the first member and the second member. The second member may include a second electrode portion facing the first electrode portion. At least one of the plurality of capsules of the anisotropic conductive material may be a broken capsule between the first electrode portion and the second electrode portion. The conductive material from the broken capsule may electrically connect the first electrode portion to the second electrode portion.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
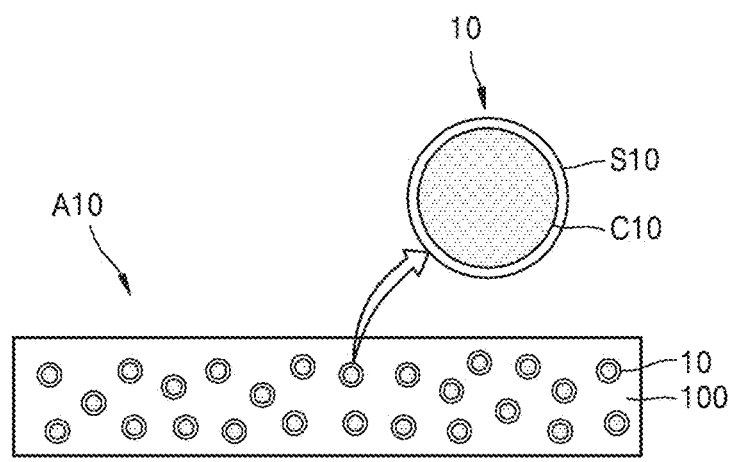
FIG. 1 is a cross-sectional view illustrating an anisotropic conductive material according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprise", "include", and/or "have", when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, anisotropic conductive materials, electronic devices including anisotropic conductive materials, and methods of manufacturing the electronic devices according to example embodiments will be described in detail with reference to the accompanying drawings. The widths and thicknesses of layers or regions illustrated in the accompanying drawings may be exaggerated for clarity and convenience of description. In the drawings, the thicknesses of layers and regions may be exaggerated for clarity. Like reference characters and/or numerals in the drawings denote like elements, and thus their description may not be repeated.

FIG. 1 is a cross-sectional view illustrating an anisotropic conductive material according to example embodiments.

Referring to FIG. 1, an anisotropic conductive material A10 may include a matrix material layer 100 and a plurality of particles 10 provided in the matrix material layer 100. The matrix material layer 100 may have an electrical insulating property. Also, the matrix material layer 100 may have an adhering (bonding) property. The matrix material layer 100 may be formed mainly of a polymer or may have a material composition including a polymer. For example, the matrix material layer 100 may include a thermosetting resin or a thermoplastic resin as the polymer. The thermosetting resin may include, for example, epoxy, melamine-formaldehyde, urea-formaldehyde, and/or phenol-formaldehyde. The thermoplastic resin may include, for example, polyvinyl chloride (PVC), polystyrene, polytetrafluoroethylene (PTFE), polypropylene, nylon, cellulose nitrate, cellulose acetate, acrylic (methacrylate), polyethylene, and/or acetal. The matrix material layer 100 may have both a thermosetting property and a thermoplastic property. In other words, the matrix material layer 100 may include a mixture of the thermosetting resin and the thermoplastic resin. In some cases, the matrix material layer 100 may include an ultraviolet (UV)-curable resin. The detailed materials (polymers/resins) of the matrix material layer 100 described herein are merely examples and may vary according to example embodiments. Also, in addition to the above polymers/resins, the matrix material layer 100 may further include one or more additives such as catalysts and hardeners.

The particles 10 provided in the matrix material layer 100 may have a capsule structure including a core portion C10 and a shell portion S10 covering the core portion C10. The core portion C10 may include a conductor, and the shell portion S10 may include an insulator. In other words, the core portion C10 may have a conductive property, and the shell portion S10 may have an insulating property. The component materials of the core portion C10 and the shell portion S10 will be described below in more detail.

The core portion C10 may include a conductive material that is in a liquid state at a room temperature (about 25° C.) or a temperature less than or equal to about 110° C. In other words, the core portion C10 may include a conductive material that is in a liquid state at a room temperature or may include a conductive material having a melting point of about 110° C. or less. The conductive material of the core portion C10 may be in a liquid state at a temperature of about 110° C. or less or at a temperature of about 100° C. or less. As an example, the conductive material of the core portion C10 may include a liquid metal. The liquid metal may include, for example, gallium (Ga), a gallium-indium (Ga—In) alloy, a gallium-indium-tin (Ga—In—Sn) alloy, and/or a gallium-indium-tin-zinc (Ga—In—Sn—Zn) alloy. Herein, the Ga—In alloy may include eutectic GaIn (EGaIn), and the Ga—In—Sn alloy may include eutectic GaInSn (EGaInSn). The liquid metal may be in a liquid state at a room temperature. For example, since the Ga—In alloy may have a melting point of about 15.3° C., the liquid metal may be in a liquid state at a temperature of more than about 15.3° C. Also, the conductive material of the core portion C10 may include a nanofiller (not illustrated). Herein, the nanofiller may refer to a fine structure having a nanoscale. For example, the core portion C10 may include a liquid metal and nanofillers contained in the liquid metal. As another example, the core portion C10 may include a suspension having nanofillers dispersed in a solvent, instead of the liquid metal. Since the nanofiller may include a conductor, the suspension may have a conductive property due to the nanofiller. Also, the suspension may include a liquid material, for example, a solution. Thus, the suspension may include a conductive material that is in a liquid state at a room temperature or a temperature of about 110° C. or less.

According to example embodiments, the conductive material of the core portion C10 may include a low melting point solder. The low melting point solder may have a melting point of about 110° C. or less (or about 100° C. or less). As an example, the low melting point solder may include a bismuth-indium (Bi—In)-based alloy, a bismuth-tin (Bi—Sn)-based alloy, an indium-bismuth (In—Bi)-based alloy, a bismuth-indium-tin (Bi—In—Sn)-based alloy, an indium-bismuth-tin (In—Bi—Sn)-based alloy, and/or an indium-tin-zinc (In—Sn—Zn)-based alloy. Herein, the In—Bi-based alloy may have a melting point of about 72° C., the Bi—In—Sn-based alloy may have a melting point of about 80° C., and the In—Bi—Sn-based alloy may have a melting point of about 60° C. The Bi—In—Sn-based alloy may have a Bi content larger than an In content, and the In—Bi—Sn-based alloy may have an In content larger than a Bi content. Similarly, the Bi—In-based alloy may have a Bi content larger than an In content, and the In—Bi-based alloy may have an In content larger than a Bi content. However, in the alloys, the element arrangement order may not necessarily represent the content ratio order. Also, the alloys may further include one or more other elements, but may not include an environmentally-regulated element such as lead (Pb) or cadmium (Cd). The low melting point solder may have fluidity (liquidity) and may be in a liquid state at a low temperature of about 110° C. or less.

The shell portion S10 may include an insulating polymer. Herein, the insulating polymer may include a material having a relatively-low elastic modulus of less than about 40 GN/m², for example, about 0.3 GN/m² to about 35 GN/m². For example, the insulating polymer may include polyurethane, melamine-formaldehyde, urea-formaldehyde, gelatin, polyurea, polystyrene, polydivinylbenzene, and/or polyamide. Among them, urea-formaldehyde may have an elastic modulus of about 7 GN/m² to about 10 GN/m². In this manner, when the shell portion S10 includes a polymer having a low elastic modulus, the shell portion S10 may be broken by a relatively-low process pressure (e.g., a bonding pressure). Thus, a process pressure may be considerably reduced in a bonding (adhering/connecting) process based on the anisotropic conductive material A10. When a low process pressure is used, various effects may be obtained accordingly. This will be described later in more detail. However, the materials of the shell portion S10 are not limited to the above polymers and may vary according to example embodiments. For example, the shell portion S10 may include ceramics such as $SiO_2$, $TiO_2$, $Al_2O_3$, and $ZrO_2$, or may include any other materials.

The shell portion S10 may have a thickness of, for example, about 30 nm to about 200 nm, or about 60 nm to about 100 nm. In some cases, the shell portion S10 may have a thickness of less than about 30 nm. The process pressure (bonding pressure) for breaking the shell portion S10 may vary according to the materials and/or thicknesses of the shell portion S10. Also, the proper thickness range thereof may vary according to the types of materials constituting the shell portion S10.

The particles 10 may have a size (diameter) of about 1 μm to about 100 μm. For example, the particles 10 may have a size (diameter) of about 5 μm to about 50 μm. The size of the particle 10 may be determined mainly by the size of the core portion C10, and the thickness ratio of the shell portion S10 in each particle 10 may be relatively small. The particle size distribution and the size of the particles 10 may be adjusted according to the process conditions for forming the particles 10. A method of forming the particles 10 and a method of controlling the size thereof will be described later in more detail with reference to FIGS. 7A to 7E.

Figure 2:
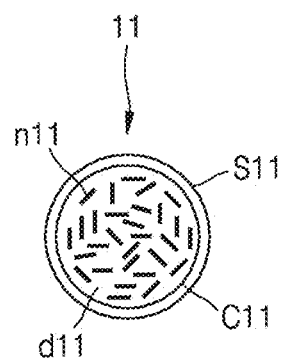
FIG. 2 is a cross-sectional view illustrating a particle that may be applied to an anisotropic conductive material according to example embodiments.

FIG. 2 is a cross-sectional view illustrating an example of a particle including nanofillers. The matrix material layer 100 may include a particle 11 of example embodiments instead of or together with the particle 10 of FIG. 1. Alternatively, the matrix material layer 100 may include a plurality of the particles 10 and a plurality of the particles 11.

Referring to FIG. 2, the particle 11 may include a core portion C11 and a shell portion S11 covering the core portion C11. The core portion C11 may include a plurality of nanofillers n11. The nanofillers n11 may be dispersed in a liquid material d11. In other words, the core portion C11 may include the liquid material d11 containing the nanofillers n11. The nanofiller n11 may include a fine structure having a nanoscale. For example, the nanofiller n11 may include one or more nanostructures from among a carbon nanotube (CNT), a carbon nanofiber (CNF), a carbon black, a fullerene, a graphene flake, a graphene particle, a metal nanowire, and/or a metal nanoparticle, but example embodiments are not limited thereto. Herein, the metal nanowire or the metal nanoparticle may include, for example, metals such as silver (Ag), copper (Cu), and gold (Au). The liquid material d11 may include a liquid metal or a solvent. The liquid metal may include, for example, gallium (Ga), a gallium-indium (Ga—In) alloy, a gallium-indium-tin (Ga—In—Sn) alloy, and/or a gallium-indium-tin-zinc (Ga—In—Sn—Zn) alloy. The solvent may include, for example, ethyl phenylacetate (EPA; $C_{20}H_{30}O_2$), chlorobenzene (PhCl; $C_6H_5Cl$), and/or hexyl acetate (HA; $C_8H_{16}O_2$). When the liquid material d11 includes the solvent and the core portion C11 includes the nanofillers n11, the core portion C11 may be a kind of suspension. The shell portion S11 of FIG. 2 may be substantially identical to or the same as the shell portion S10 described with reference to FIG. 1.

Figure 3:
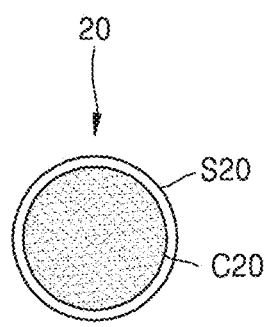
FIG. 3 is a cross-sectional view illustrating a self-healing capsule that may be applied to an anisotropic conductive material according to example embodiments.

FIG. 3 is a cross-sectional view illustrating a self-healing capsule (e.g., capsule for self-healing) 20 that may be added to an anisotropic conductive material according to example embodiments. One or more self-healing capsules 20 may be dispersed and used in the matrix material layer 100 of FIG. 1. In this case, the anisotropic conductive material may include a plurality of particles 10 and at least one self-healing capsule 20 in the matrix material layer 100. At least one of the particles 10 may be replaced by the particle 11 of FIG. 2.

Referring to FIG. 3, the self-healing capsule 20 may include a core portion C20 and a shell portion S20 covering the core portion C20. The core portion C20 may include a self-healing material. The self-healing material of the core portion C20 may include an underfill material used in a semiconductor package process. The underfill material may be the same as or similar to the material of the matrix material layer 100 of FIG. 1. For example, the underfill material may include a thermosetting resin, a thermoplastic resin, and/or a UV-curable resin. The shell portion S20 may include a polymer and/or a ceramic. The materials and properties of the shell portion S20 may be identical or similar to those of the shell portion S10 described with reference to FIG. 1.

A package bonding portion (bonding layer) formed by using the anisotropic conductive material including one or more self-healing capsules 20 may have a self-healing function. When a crack occurs in the package bonding portion due to various external factors, since the material of the core portion C20 may flow out from the self-healing capsule 20 and fill the crack, the package bonding portion may be self-healed or self-restored. This will be described later in more detail with reference to FIG. 16.

FIG. 1 illustrates the case where the particles 10 are dispersed (or distributed) uniformly or relatively uniformly in the matrix material layer 100. However, according to example embodiments, the particles 10 may be distributed (or dispersed) non-uniformly in the matrix material layer 100. An example thereof is illustrated in FIG. 4.

Figure 4:
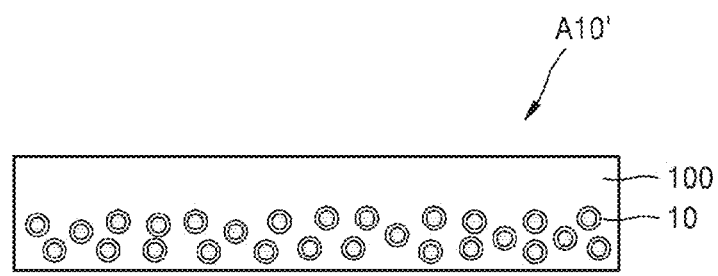
FIG. 4 is a cross-sectional view illustrating an anisotropic conductive material according to example embodiments.

Referring to FIG. 4, an anisotropic conductive material A10' may include a matrix material layer 100 and a plurality of particles 10 distributed (or dispersed) in the matrix material layer 100. The particles 10 may be distributed at different densities according to regions in the thickness direction of the matrix material layer 100. For example, as illustrated in FIG. 4, the particles 10 may be dispersed uniformly or relatively uniformly in a lower region of the matrix material layer 100, and the particles 10 may not be present or may be dispersed at a low density in an upper region of the matrix material layer 100. However, the distributions of the particles 10 described herein are merely examples and may vary according to example embodiments. The configurations and materials of the particle 10 and the matrix material layer 100 may be identical or similar to those described with reference to FIG. 1.

Additionally, the volume ratio of the particles 10 in the anisotropic conductive materials A10 and A10' of FIGS. 1 and 4 may be less than about 10 vol %. For example, the volume ratio of the particles 10 in the anisotropic conductive materials A10 and A10' may be less than or equal to about 7 vol %, or less than or equal to about 5 vol %. The content of the particles 10 may be adjusted properly according to the process condition and/or the structure of a bonding target object.

The anisotropic conductive materials A10 and A10' of FIGS. 1 and 4 may have a kind of film shape. In other words, the anisotropic conductive materials A10 and A10' of FIGS. 1 and 4 may be an anisotropic conductive film (ACF). In this case, a release layer and a support layer may be provided on one side of the anisotropic conductive material (anisotropic conductive film) A10 or A10'. An example thereof is illustrated in FIG. 5.

Figure 5:
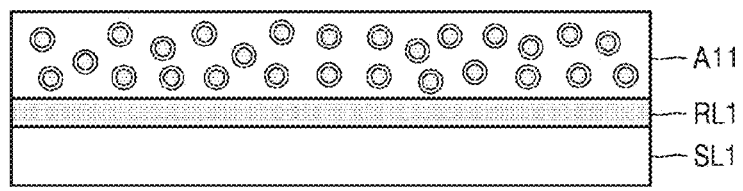
FIG. 5 is a cross-sectional view illustrating a film structure including an anisotropic conductive material according to example embodiments.

Referring to FIG. 5, in example embodiments, an anisotropic conductive film A11 may be supported by a support layer SL1, and a release layer RL1 may be provided between the support layer SL1 and the anisotropic conductive film A11. The anisotropic conductive film A11 may be easily separated from the support layer SL1 by the release layer RL1. The anisotropic conductive film A11 may have an identical or similar configuration to the anisotropic conductive material A10 of FIG. 1.

According to example embodiments, a release layer RL1 and a support layer SL1 may be provided on both sides of an anisotropic conductive film A11. An example thereof is illustrated in FIG. 6.

Figure 6:
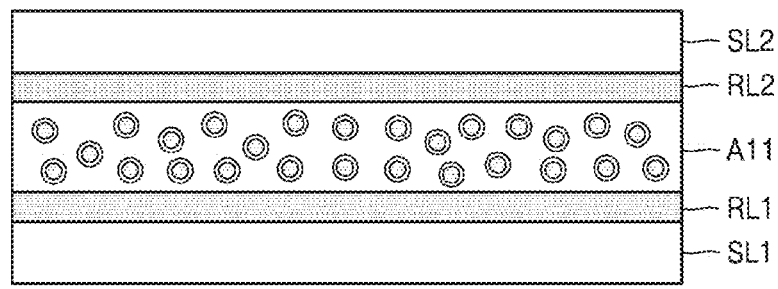
FIG. 6 is a cross-sectional view illustrating a film structure including an anisotropic conductive material according to example embodiments.

Referring to FIG. 6, a first support layer SL1 may be provided on a bottom surface of an anisotropic conductive film A11, and a first release layer RL1 may be provided between the first support layer SL1 and the anisotropic conductive film A11. Also, a second support layer SL2 may be provided on a top surface of the anisotropic conductive film A11, and a second release layer RL2 may be provided between the second support layer SL2 and the anisotropic conductive film A11. Although not illustrated, a second anisotropic conductive film may be provided on the second support layer SL2, and a third release layer may be provided between the second support layer SL2 and the second anisotropic conductive film.

Also, a multilayer structure including the anisotropic conductive film A11 of FIGS. 5 and 6 may have a tape shape elongating in a certain direction, and it may be rolled and used in a roll shape.

Additionally, the anisotropic conductive material (e.g., A10 of FIG. 1) according to example embodiments may have a paste shape instead of a film shape. In other words, the anisotropic conductive material (e.g., A10 of FIG. 1) may be an anisotropic conductive paste (ACP). Both the anisotropic conductive paste (ACP) and the anisotropic conductive film (ACF) may be referred to as "anisotropic conductive adhesive (ACA)".

The particles/capsules 10, 11, and 20 described with reference to FIGS. 1 to 3 may be manufactured by various methods. For example, the particles/capsules 10, 11, and 20 may be manufactured by a microencapsulation process. An example thereof is illustrated in FIGS. 7A to 7E.

FIGS. 7A to 7E are diagrams illustrating a method of manufacturing an anisotropic conductive material according to example embodiments.

Figure 7A:
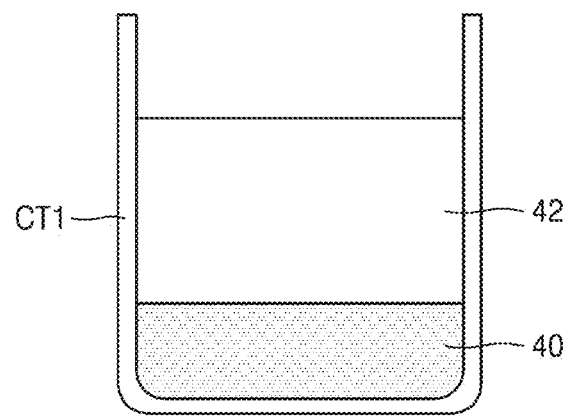
FIGS. 7A to 7E are diagrams illustrating a method of manufacturing an anisotropic conductive material according to example embodiments.

Referring to FIG. 7A, a conductive liquid material 40 and a solvent material 42 having a different specific gravity from the conductive liquid material 40 may be inserted into a container CT1. The specific gravity of the solvent material 42 may be smaller than the specific gravity of the conductive liquid material 40. Thus, the solvent material 42 may be located above the conductive liquid material 40.

The conductive liquid material 40 may include, for example, a liquid metal or a molten low melting point solder. The liquid metal may include, for example, gallium (Ga), a gallium-indium (Ga—In) alloy, a gallium-indium-tin (Ga—In—Sn) alloy, and/or a gallium-indium-tin-zinc (Ga—In—Sn—Zn) alloy. For example, the molten low melting point solder may have a melting point of about 110° C. or less (or about 100° C. or less) and may include a bismuth-indium (Bi—In)-based alloy, a bismuth-tin (Bi—Sn)-based alloy, an indium-bismuth (In—Bi)-based alloy, a bismuth-indium-tin (Bi—In—Sn)-based alloy, an indium-bismuth-tin (In—Bi—Sn)-based alloy, and/or an indium-tin-zinc (In—Sn—Zn)-based alloy. The conductive liquid material 40 may have a configuration including nanofillers (not illustrated). For example, the conductive liquid material 40 may include a liquid metal and nanofillers contained in the liquid metal, or may include a suspension having nanofillers dispersed (or distributed) in a solvent instead of a liquid metal. The solvent of the suspension may include a different material from the solvent material 42. For example, the solvent of the suspension may include ethyl phenylacetate (EPA; $C_{20}H_{30}O_2$), chlorobenzene (PhCl; $C_6H_5Cl$), and/or hexyl acetate (HA; $C_8H_{16}O_2$). The nanofiller may include, for example, one or more conductors from among a carbon nanotube (CNT), a carbon nanofiber (CNF), a carbon black, a fullerene, a graphene flake, a graphene particle, a metal nanowire, and a metal nanoparticle. The metal nanowire or the metal nanoparticle may include, for example, metals such as silver (Ag), copper (Cu), and gold (Au). The solvent material 42 provided in the container CT1 together with the conductive liquid material 40 may include, for example, water. However, the solvent material 42 is not limited to water and may vary according to example embodiments. For example, the solvent material 42 may include any material (liquid) that is not mutually dissolved with the conductive liquid material 40 and has a different specific gravity from the conductive liquid material 40.

Figure 7B:
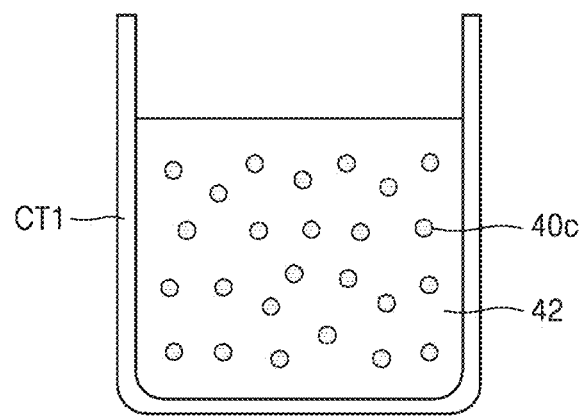

Thereafter, the conductive liquid material 40 and the solvent material 42 may be agitated/stirred by using an agitating/stirring apparatus (not illustrated). In this case, if necessary, an ultrasonic wave may be applied to the conductive liquid material 40 and the solvent material 42 by using an ultrasonic generator (not illustrated). As a result of the agitation or the agitation and the ultrasonic wave application, as illustrated in FIG. 7B, the conductive liquid material 40 may be divided into a plurality of fine droplets 40c to be dispersed (or distributed) into the solvent material 42. The case of performing both the agitation process and the ultrasonic wave application process may reduce the size of the droplet 40c in comparison with the case of performing only the agitation process.

In some cases, in the operation of FIG. 7A, after inserting only the solvent material 42 into the container CT1, while dripping or pouring the conductive liquid material 40 into the solvent material 42 from the top of the container CT1, the agitation process and/or the ultrasonic wave application process may be performed. Also by this method, the intermediate result illustrated in FIG. 7B may be obtained.

Figure 7C:
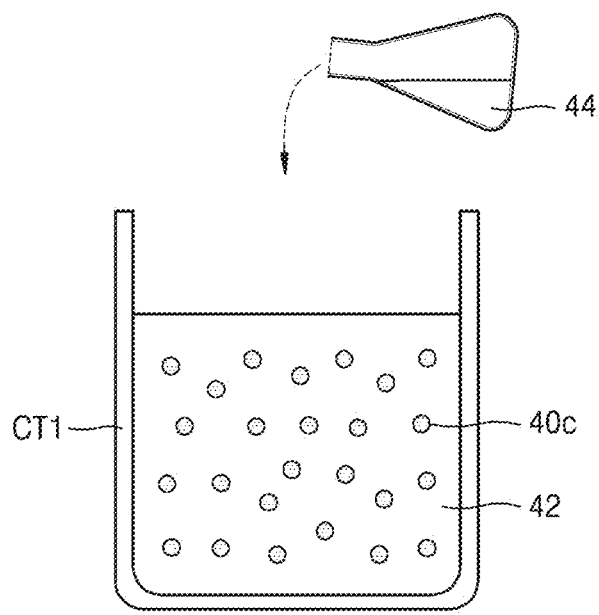

Referring to FIG. 7C, a polymer solution 44 may be provided (dripped or poured) into the solvent material 42 having the fine droplets 40c dispersed therein. The polymer solution 44 may be a solution of a polymer material into a solvent, and the solvent of the polymer solution 44 may be selected from among the solvents that are not mutually dissolved with the material of the droplet 40c.

Figure 7D:
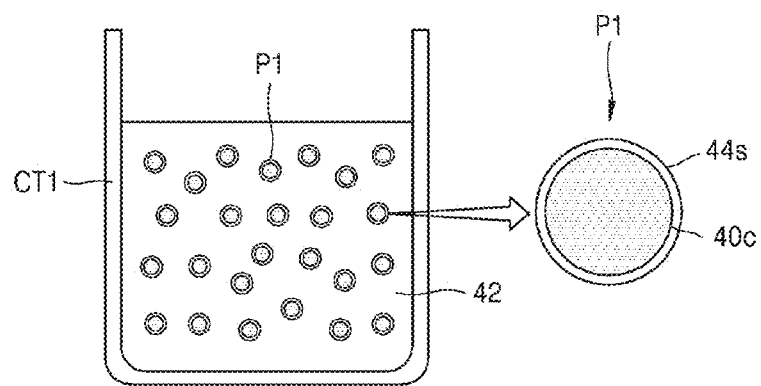

When the polymer solution 44 is dripped or poured into the solvent material 42, the surface of the droplet 40c may be coated with the polymer of the polymer solution 44 to form a shell portion 44s as illustrated in FIG. 7D. The polymer may be physically/chemically adhered to the surface of the droplet 40c. In other words, due to its property, the polymer may have a relatively great affinity with respect to the surface of the droplet 40c. Thus, by the polymer coating, the droplet 40c and the shell portion 44s covering the droplet 40c may be formed into a particle (capsule) P1. The droplet 40c of each particle P1 dispersed in the solvent material 42 may be referred to as a "core portion" surrounded by the shell portion 44s. In some cases, a cooling process or an aging process may be further performed to harden/consolidate the shell portion 44s. In this case, a portion of the droplet (core portion) 40c may be hardened to a certain degree.

Thereafter, a plurality of particles P1 may be separated from the solvent material 42. For example, the particles P1 may be separated from the solvent material 42 by a method such as filtration or centrifugation. Thereafter, a drying process may be performed on the separated particles P1. Through the drying process, the solvent remaining on/in the shell portion 44s may be vaporized or volatized.

Figure 7E:
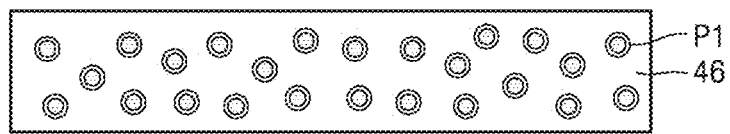

Referring to FIG. 7E, the particles P1 may be dispersed (or distributed) into a matrix material layer 46 to form an anisotropic conductive material. For example, the particles P1 may be dispersed into a polymer resin, a substrate may be coated with the polymer resin having the particles P1 dispersed therein, and then the resulting structure may be dried to form the anisotropic conductive material including the particles P1 dispersed in the matrix material layer 46.

In the method of FIGS. 7A to 7E, various factors may affect the control of the size (diameter) of the particle P1. For example, as described with reference to FIGS. 7A and 7B, the speed of the agitation process (agitation speed), the intensity of the ultrasonic wave application process (ultrasonic wave intensity), the temperature of the container CT1, the temperature of the solvent material 42, the temperature of the conductive liquid material 40, the pH of the solvent material 42, and/or the pH of the conductive liquid material 40 may affect the size of the formed droplet 40c and thus may affect the size of the particle P1. Thus, the size of the formed particle P1 may be easily controlled by controlling various process conditions.

Also, the particles (capsules) 10, 11, and 20 described with reference to FIGS. 1 to 3 may be formed according to the types of starting materials used in the method of FIGS. 7A to 7E. For example, when the conductive liquid material 40 includes the liquid metal in the operation of FIG. 7A, the core portion (droplet) 40c of the formed particle P1 may include the liquid metal. As another example, when the conductive liquid material 40 includes the nanofillers in the operation of FIG. 7A, the core portion (droplet) 40c of the formed particle P1 may include the nanofillers. As another example, when the conductive liquid material 40 includes the molten low melting point solder in the operation of FIG. 7A, the core portion (droplet) 40c of the formed particle P1 may include the low melting point solder. As another example, when the underfill material is used instead of the conductive liquid material 40 in the operation of FIG. 7A, the core portion (droplet) 40c of the formed particle P1 may include the underfill material.

FIGS. 7A to 7E illustrate the method of forming the particles (capsules) P1 by the microencapsulation process and the method of the anisotropic conductive material by using the same. However, this is merely an example and may vary according to example embodiments. For example, a plurality of particles (capsules) may be formed by various methods such as a spray drying process, a dripping process, a microemulsion process, a coacervation process, and an interfacial polymerization process, and an anisotropic conductive material according to example embodiments may be manufactured by using the same.

Figure 8A:
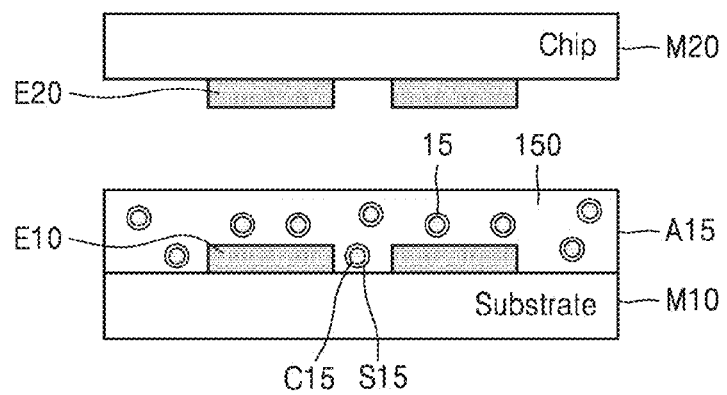
FIGS. 8A to 8C are cross-sectional views illustrating a method of manufacturing an electronic device by using an anisotropic conductive material according to example embodiments.
Figure 8B:
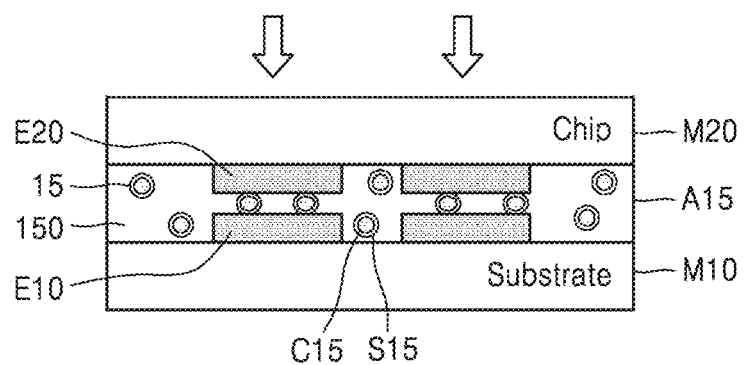
Figure 8C:
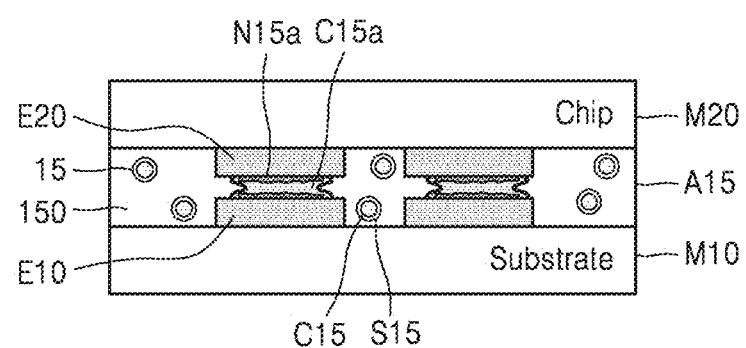

FIGS. 8A to 8C are cross-sectional views illustrating a method of manufacturing an electronic device by using an anisotropic conductive material according to example embodiments.

Referring to FIG. 8A, a first member M10 including one or more first electrode portions E10 may be prepared. The first electrode portions E10 may be provided on one side of the first member M10. Also, a second member M20 including one or more second electrode portions E20 may be prepared. The second electrode portions E20 may be provided on one side of the second member M20. The first electrode portion E10 and the second electrode portion E20 may include a kind of pad or bump or any similar element. The first electrode portion E10 and the second electrode portion E20 may include, for example, a metal compound or metals such as Au, Cu, and Ag. The first member M10 may include, for example, a substrate or a panel. The second member M20 may include, for example, a semiconductor chip or a semiconductor chip package. For convenience' sake, the first member M10 will be referred to as "substrate" and the second member M20 will be referred to as "chip"; however, this is merely an example and may vary according to example embodiments.

In order to adhere (bind) the second member M20 to the first member M10, an anisotropic conductive material A15 according to example embodiments may be provided between the first member M10 and the second member M20. For example, the anisotropic conductive material A15 may be provided on the first member M10 to cover the first electrode portions E10, and the second member M20 may be located on/above the anisotropic conductive material A15. The second electrode portions E20 of the second member M20 may be arranged to face the first electrode portions E10 of the first member M10.

Herein, the anisotropic conductive material A15 may have an identical or similar configuration to the anisotropic conductive materials A10 and A10' described with reference to FIGS. 1 to 4. For example, the anisotropic conductive material A15 may include a matrix material layer 150 and a plurality of particles 15 dispersed in the matrix material layer 150. The particles 15 may include a conductive core portion C15 and an insulating shell portion S15 covering the conductive core portion C15. The materials, properties, and/or sizes (diameters/thicknesses) of the core portion C15 and the shell portion S15 may be identical or similar to those of the core portions C10 and C11 and the shell portions S10 and S11 described with reference to FIGS. 1 and 2. The content, distribution, size, and/or particle size distribution of the particles 15 contained in the anisotropic conductive material A15 may be controlled properly according to example embodiments.

Referring to FIG. 8B, the first member M10 and the second member M20 may be pressed (pressurized) with the anisotropic conductive material A15 therebetween. In this case, if necessary, a heating process may be performed to heat the anisotropic conductive material A15 to a certain temperature. Through the pressing process or the pressing and heating process, the insulating shell portion S15 of the particle(s) 15 located between the first electrode portion E10 and the second electrode portion E20 corresponding thereto may be broken and the conductive core portion C15 may be outflowed to electrically connect the first and second electrode portions E10 and E20. A result thereof is illustrated in FIG. 8C.

Referring to FIG. 8C, the outflowed core portion C15a may be present between the first electrode portion E10 and the second electrode portion E20 corresponding thereto, and the first electrode portion E10 and the second electrode portion E20 corresponding thereto may be electrically connected by the outflowed core portion C15a. Also, an intermetallic compound N15a may be formed between the outflowed core portion C15a and the first electrode portion E10 and/or between the outflowed core portion C15a and the second electrode portion E20. Herein, as an example case, the intermetallic compound N15a may be formed both between the outflowed core portion C15a and the first electrode portion E10 and between the outflowed core portion C15a and the second electrode portion E20. The intermetallic compound N15a may be formed by a reaction between the outflowed core portion C15a and the electrode portion E10/E20. As an example, when the first electrode portion E10 includes Au and the outflowed core portion C15a includes Ga, $AuGa_2$ may be formed as the intermetallic compound N15a by the reaction therebetween. Also, when the first electrode portion E10 includes any one of Au, Cu, and Ag and the outflowed core portion C15a includes a Bi—In-based alloy, a Bi—Sn-based alloy, an In—Bi-based alloy, a Bi—In—Sn-based alloy, an In—Bi—Sn-based alloy, or an In—Sn—Zn-based alloy, the intermetallic compound N15a may be formed by the reaction between the In or Sn of the outflowed core portion C15a and the Au, Cu, or Ag of the first electrode portion E10. The materials of the formed intermetallic compound N15a may vary according to the materials of the outflowed core portion C15a and the materials of the first electrode portion E10 or the second electrode portion E20. Also, when the outflowed core portion C15a includes a nanofiller and the nanofiller includes a metallic material, the intermetallic compound N15a may be formed by the reaction between the metallic material of the nanofiller and the first electrode portion E10 and/or the second electrode portion E20.

When the outflowed core portion C15a includes a solvent such as EPA, PhCl, or HA, most of the solvent may be removed from the anisotropic conductive material A15 by being easily vaporized in the operation of FIG. 8C or in the subsequent operation thereof.

In addition, a hardening process may be performed to harden the matrix material layer 150. The hardening process may be performed by using heat and/or ultraviolet light. The hardening process may be performed as a separate process after the operation of FIG. 8C. However, in some cases, the matrix material layer 150 may be hardened in the operation of FIG. 8B or 8C.

In example embodiments, since the shell portion S15 of the particle 15 may be broken at a relatively-low pressure, the pressure of the pressing process (bonding pressure) used in the operation of FIG. 8B may be reduced. In particular, when the shell portion S15 is formed of a polymer having a low elastic modulus and the thickness of the shell portion S15 is properly controlled, the shell portion S15 may be broken by a considerably-low process pressure (bonding pressure). When the anisotropic conductive film (ACF) of the related art is used, a bonding pressure of about 30 MPa or more, for example, about 30 MPa to about 100 MPa may be required. However, according to example embodiments, the bonding (connecting) process may be performed even by a low bonding pressure corresponding to about ½ or less, for example, about ⅓ of the bonding pressure of the related art. In some cases, the first electrode portion E10 and the second electrode portion E20 may be electrically connected by a pressure in a range of about 0 MPa to less than about 30 MPa, by a low pressure in a range of about 0 MPa to about 10 MPa or less, or by a lower pressure in a range of about 0 MPa to about 3 MPa or less. In this manner, since the bonding (connecting) process may be performed by a low pressure, the problems caused by a high pressure may be suppressed or prevented and the process load and cost may be reduced. For example, when the bonding process is performed by a relatively-high pressure as in the related art, the substrate (first member M10) or the chip (second member M20) may be damaged and the reliability of the manufactured device may be degraded. However, as described above, according to example embodiments, since the bonding (connecting) process may be performed by a considerably-low pressure in comparison with the related art, the problems caused by a high pressure may be suppressed or prevented and the device having excellent reliability may be manufactured. However, the bonding pressure used in example embodiments may not necessarily be lower than about 30 MPa. Depending on the thickness and material of the shell portion S15, the pressure for the bonding (connecting) process may be higher than about 30 MPa.

Also, according to example embodiments, the temperature of the heating process used in the bonding (connecting) process may be reduced. In other words, the temperature of the heading process (bonding temperature) used in the operation of FIG. 8B may be reduced. Since the core portion C15 of the particle 15 may include a conductive material that is in a liquid state at a room temperature or a temperature of about 110° C. or less, the bonding (connecting) process may be performed at a temperature of about 110° C. or less. When the core portion C15 includes a conductive material that is in a liquid state at a room temperature, the bonding (connecting) process may be performed at a room temperature without the heating process. In this case, the intermetallic compound N15a may also be formed at a room temperature. When the core portion C15 includes a low melting point solder having a melting point of about 110° C. or less (or about 100° C. or less), the bonding (connecting) process may be performed at a temperature corresponding to the melting point of the low melting point solder or at a temperature higher than the melting point of the low melting point solder. Even in this case, the used temperature (bonding temperature) may be about 110° C. or less (or about 100° C. or less). When the anisotropic conductive film (ACF) of the related art is used, a bonding temperature of about 150° C. or more may be required to obtain a desired level of contact resistance. In this case, due to the high temperature, the substrate (first member M10) or the chip (second member M20) may be deformed (strained), the device performance may be degraded, and the bonding alignment may be distorted. Consequently, the error rate may be increased and the device reliability may be degraded. However, according to example embodiments, the process temperature (bonding temperature) may be reduced by about 50° C. or more or by about 80° C. or more in comparison with the related art. Thus, the problems caused by the high process temperature (bonding temperature) may be suppressed or prevented, and the process load and the manufacturing cost may be reduced. In particular, since the problem of a bonding alignment distortion may be suppressed or prevented, the device reliability may be improved. If the bonding (connecting) process is performed at a room temperature without the heating process, the problems caused by the high-temperature heating process may be fundamentally limited (and/or prevented).

Also, according to example embodiments, since one or more core portions C15 of one or more particles 15 are outflowed to electrically connect the first and second electrode portions E10 and E20 corresponding to each other, a relatively-large contact area may be formed between the outflowed core portions Cl 5a and the first and second electrode portions E10 and E20. For example, the contact area between the outflowed core portion C15a and the first core portion E10 or the second electrode portion E20 may be about 0.75 µm² or more or about 1 µm² or more. Herein, the contact area may include both the indirect contact with the intermetallic compound N15a therebetween and the direct contact without the intermetallic compound N15a therebetween. Since the liquid material of the core portion C15 may be outflowed to form a relatively-large contact area with the first and second electrode portions E10 and E20, an excellent contact property and a low contact resistance may be ensured. In particular, when the intermetallic compound N15a is formed between the outflowed core portion C15a and the first and second electrode portions E10 and E20, the contact resistance may be further reduced and the contact property may be further improved by the intermetallic compound N15a. The intermetallic compound N15a may be formed at a room temperature or a temperature of about 110° C. or less.

Additionally, the outflowed core portion C15a between the first electrode portion E10 and the second electrode portion E20 corresponding thereto may maintain the position within the gap between the first electrode portion E10 and the second electrode portion E20. Since the distance between the first electrode portion E10 and the second electrode portion E20 corresponding thereto is relatively small and the matrix material layer 150 is present around the outflowed core portion C15a, the outflowed core portion C15a may identically or substantially maintain the original position without deviating from the gap therebetween.

Figure 9:
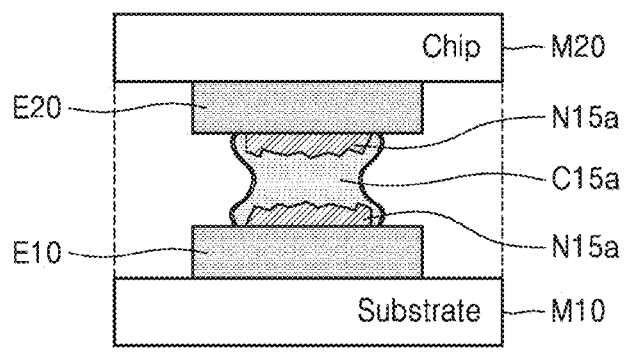
FIG. 9 is a cross-sectional view illustrating an example of an electronic device including an anisotropic conductive material according to example embodiments.

FIG. 9 illustrates an example of an electronic device according to example embodiments, which may correspond to an enlarged view of the principal part of FIG. 8C.

Figure 10:
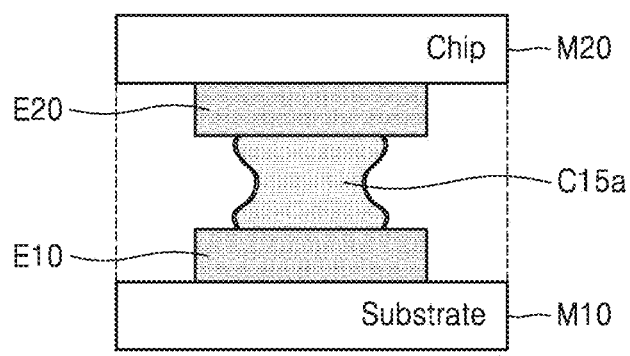
FIG. 10 is a cross-sectional view illustrating an example of an electronic device including an anisotropic conductive material according to example embodiments.

Referring to FIG. 10, the outflowed core portion C15a may be present between the first and second electrode portions E10 and E20, and the intermetallic compound N15a may not be formed unlike the illustration of FIG. 9. Depending on the materials of the outflowed core portion C15a and the materials of the electrode portions E10 and 20, or depending on the conditions of the bonding (connecting) process, the intermetallic compound (N15a of FIG. 9) may not be formed.

Figure 11:
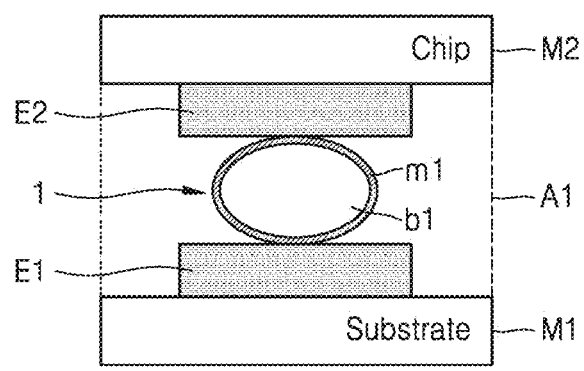
FIG. 11 is a cross-sectional view illustrating an electronic device manufactured by using an anisotropic conductive film according to a comparative example.

FIG. 11 is a cross-sectional view illustrating an electronic device manufactured by using an anisotropic conductive film A1 according to a comparative example.

Referring to FIG. 11, the anisotropic conductive film A1 according to the comparative example may include a conductive ball 1. The conductive ball 1 may include an insulating polymer bead b1 and a conductive metal coating film m1 covering the insulating polymer bead b1. Since the particle (e.g., 15 of FIG. 8A) according to example embodiments includes the conductive core portion C15 and the insulating shell portion S15 covering the conductive core portion C15, the conductive ball 1 according to the comparative example may be said to have an opposite structure to the particle according to example embodiments. When a first electrode portion E1 of a first member M1 and a second electrode portion E2 of a second member M2 are connected by the anisotropic conductive film A1 including the conductive ball 1 according to the comparative example, the first and second electrode portions E1 and E2 may be electrically connected by the conductive metal coating film m1. When the conductive ball 1 is strained to some degree by receiving a pressure between the first and second electrode portions E1 and E2, a certain degree of contact area may be ensured and the first and second electrode portions E1 and E2 may be electrically connected to each other. In this case, generally, a bonding temperature of about 150° C. or more and a bonding pressure of at least about 30 MPa or more may be required to reduce the contact resistance. In other words, both a relatively-high bonding temperature and a relatively-high bonding pressure may be required. Thus, various problems may be caused by the high bonding temperature and the high bonding pressure. Also, the connection between the two electrode portions E1 and E2 by the conductive ball 1 may be referred to as an electrical connection by "simple physical contact". In this case, the contact between the conductive ball 1 and the electrode portions E1 and E2 may be a narrow-area contact similar to a point contact, and an intermetallic compound may not be formed therebetween.

Thus, it may be difficult to ensure an excellent contact property and a low contact resistance.

However, according to example embodiments, as described above, the bonding temperature and the bonding pressure may be reduced considerably in comparison with the related art, and the excellent contact property and the low contact resistance may be easily ensured. Thus, according example embodiments, the electronic device having excellent performance and reliability may be easily manufactured.

Hereinafter, with reference to FIGS. 12 and 13, a description will be given of the problems that may be caused when the bonding process for the electronic device is performed by using the anisotropic conductive film A1 including the conductive ball 1 according to the comparative example.

Figure 12:
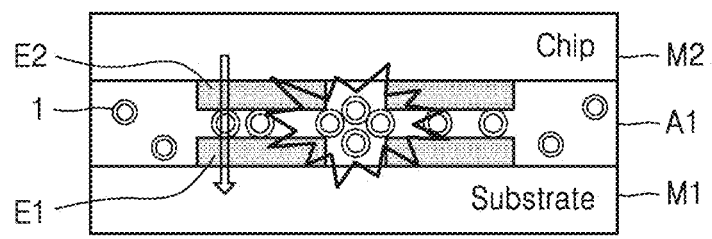
FIG. 12 is a cross-sectional view illustrating a problem of an electronic device including an anisotropic conductive film according to a comparative example.

As illustrated in FIG. 12, when a large conductive ball 1 is present or too many conductive balls 1 are present in a certain region of the anisotropic conductive film A1, an undesired electrical connection (short) may occur between the adjacent electrode portions E1 and E2. In other words, a lateral connection may occur instead of a vertical connection. The possibility of occurrence of this problem may increase when the distance (pitch) between the first electrode portions E1 and the distance (pitch) between the second electrode portions E2 are small. In other words, the possibility of occurrence of the short problem as in FIG. 12 may be high in a device having a fine pitch between electrodes.

Figure 13:
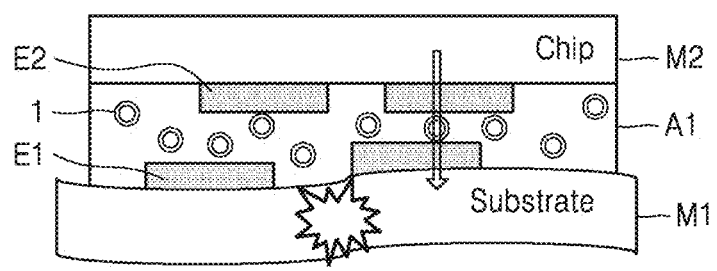
FIG. 13 is a cross-sectional view illustrating a problem of an electronic device including an anisotropic conductive film according to a comparative example.

As illustrated in FIG. 13, the first member M1 may be deformed (strained) and thus the bonding alignment may be distorted. This problem may occur when using a substrate (first member M1) that may be easily deformed (stained) by a bonding process temperature of about 150° C. or more or by a bonding process pressure of about 30 MPa or more.

The problems of FIGS. 12 and 13 may occur separately or in combination, and these problems may cause the increase of the error rate of the electronic device.

Figure 14:
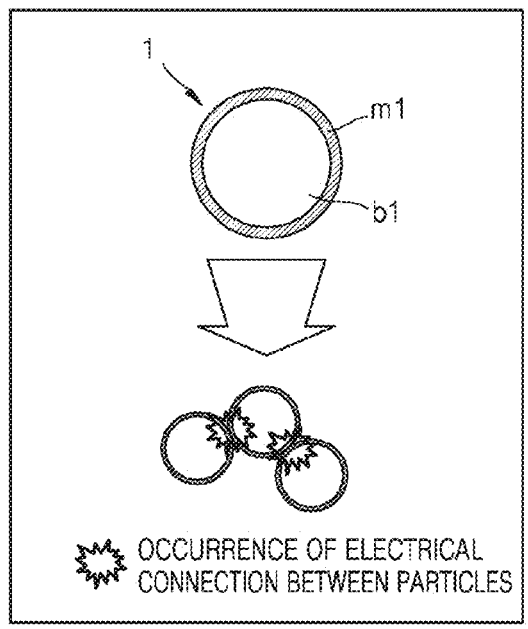
FIG. 14 is a diagram illustrating a short problem caused by a conductive ball used in an anisotropic conductive film according to a comparative example.

FIG. 14 is a diagram illustrating a short problem caused by the conductive ball 1 used in the anisotropic conductive film according to a comparative example.

Referring to FIG. 14, since the conductive ball (particle) 1 includes the insulating polymer bead b1 and the conductive metal coating film m1 covering the insulating polymer bead b1, when a plurality of conductive balls (particles) 1 contact each other, an electrical connection may easily occur between the particles. When the electrical connection between the particles occurs between the adjacent electrode portions E1 and E2 of FIG. 12, an undesired electrical connection (short) may occur.

However, the use of the anisotropic conductive material according to example embodiments may limit and/or prevent the problem illustrated in FIG. 14. This will be described below with reference to FIG. 15.

Figure 15:
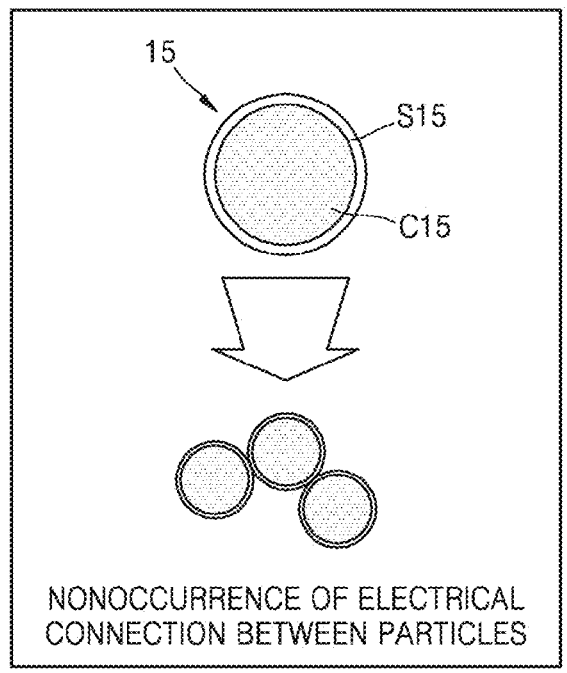
FIG. 15 is a diagram illustrating a short limiting (and/or preventing) effect of a particle used in an anisotropic conductive material according to example embodiments.

Referring to FIG. 15, a particle (capsule) 15 used in an anisotropic conductive material according to example embodiments may include a conductive core portion C15 and an insulating shell portion S15 covering the conductive core portion C15. Thus, even when a plurality of particles 15 contact each other, an electrical connection between the particles is limited (and/or prevented) by the insulating shell portion S15 and the insulating property thereof may be maintained. Thus, the short problem illustrated in FIGS. 12 and 14 may be limited (and/or prevented). Therefore, the use of the particles 15 according to example embodiments may limit and/or prevent or suppress the possibility of an error caused by the short when manufacturing the electronic device including electrodes having a fine pitch. In other words, the anisotropic conductive material including the particles 15 according to example embodiments may be advantageously used to implement the electronic device including electrodes having a fine pitch.

Figure 16:
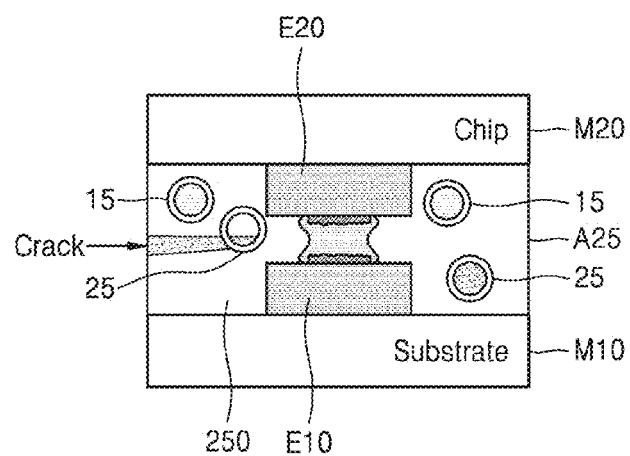
FIG. 16 is a cross-sectional view illustrating an electronic device manufactured by using an anisotropic conductive material according to example embodiments.

FIG. 16 is a cross-sectional view illustrating an electronic device manufactured by using an anisotropic conductive material according to example embodiments. The anisotropic conductive material A25 of FIG. 16 may further include a self-healing capsule 25. The self-healing capsule 25 may be identical to the self-healing capsule 20 described with reference to FIG. 3.

Referring to FIG. 16, by using the anisotropic conductive material A25 including the self-healing capsule 25 and a plurality of particles 15 in a matrix material layer 250, a first member M10 and a second member M20 may be adhered to each other, and electrode portions E10 and E20 thereof may be electrically connected to each other. Through a hardening process, the matrix material layer 250 of the anisotropic conductive material A25 may function as both a bonding portion and a support portion. Thus, the anisotropic conductive material A25 may be referred to as a bonding portion or a support portion. However, a crack may occur at the anisotropic conductive material A25 due to various external factors (e.g., a physical impact, a thermal stress, and/or a substrate strain), and the crack may be propagated to cause a problem such as delamination. However, according to example embodiments, since the self-healing capsule 25 is present in the anisotropic conductive material A25, when a crack occurs thereat, a self-healing or self-restoring function may be performed to fill the crack with the underfill material that is outflowed from the core portion of the self-healing capsule 25 adjacent to the crack. The material of the core portion may be hardened by reacting with a catalyst material that is present in the matrix material layer 250. In this manner, when the self-healing capsule 25 is used, since a possible crack caused by various external factors may be self-healed (self-restored), the bonding reliability thereof may be improved and the durability of the electronic device may be improved.

Anisotropic conductive materials according to example embodiments may be used to manufacture various electronic devices (electronic apparatuses) and semiconductor devices (semiconductor apparatuses).

Figure 17:
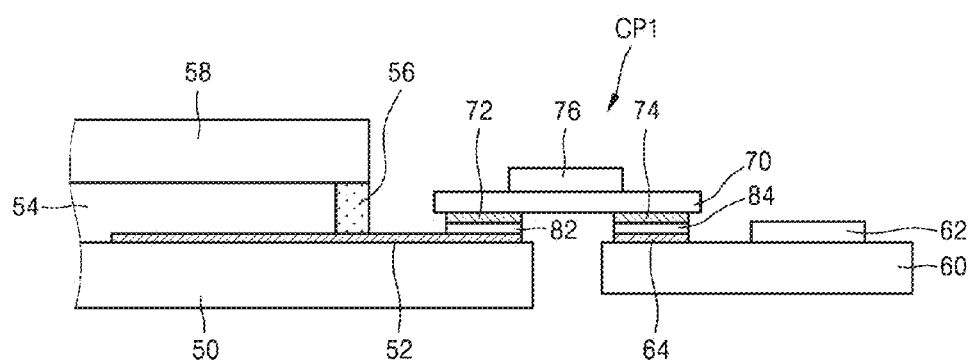
FIG. 17 is a cross-sectional view illustrating an example of an electronic device including an anisotropic conductive material according to example embodiments.

FIG. 17 is a cross-sectional view illustrating an example of an electronic device including an anisotropic conductive material according to example embodiments. The electronic device of example embodiments may include, for example, a display device such as a liquid crystal display (LCD).

Referring to FIG. 17, a thin film transistor (TFT) array substrate 50 including a plurality of TFTs may be prepared, and a color filter substrate 58 facing the TFT array substrate 50 may be prepared. A liquid crystal layer 54 may be provided between the TFT array substrate 50 and the color filter substrate 58, and a seal 56 may be provided to seal the liquid crystal layer 54. A first electrode pad 52 may be prepared on the TFT array substrate 50. The first electrode pad 52 may have a structure extending outside the seal 56 from a region in which the liquid crystal layer 54 is formed. However, the above shape and formation range of the first electrode pad 52 are merely examples and may vary according to example embodiments. The TFT array substrate 50, the color filter substrate 58, and the liquid crystal layer 54 provided therebetween may be said to constitute a "display panel".

A printed circuit board (PCB) substrate 60 may be prepared to be spaced apart from the TFT array substrate 50. The PCB substrate 60 may include a chip 62. Also, the PCB substrate 60 may include a second electrode pad 64.

A driver integrated circuit (IC) package CP1 may be provided between the TFT array substrate 50 and the PCB substrate 60 to connect the TFT array substrate 50 and the PCB substrate 60 to each other. The driver IC package CP1 may include, for example, a driver IC 76 mounted on a carrier tape 70. Also, the driver IC package CP1 may include a first electrode element 72 and a second electrode element 74 that are provided on a bottom surface of the carrier tape 70. The driver IC package CP1 may be referred to as a tape carrier package (TCP).

The first electrode pad 52 and the first electrode element 72 may be electrically connected and bonded to each other by an anisotropic conductive material (anisotropic conductive film) 82 provided therebetween. The anisotropic conductive material (anisotropic conductive film) 82 may include one of the above-described anisotropic conductive materials according to example embodiments.

A bonding layer 84 may be provided between the second electrode pad 64 and the second electrode element 74 to electrically connect the second electrode pad 64 and the second electrode element 74. The bonding layer 84 may include a general solder material. As another example, the bonding layer 84 may be formed by using one of the above-described anisotropic conductive materials according to example embodiments. In the latter case, the bonding layer 84 may have an identical or similar configuration to the anisotropic conductive material (anisotropic conductive film) 82.

Although FIG. 17 illustrates an example of an electronic device including an anisotropic conductive material according to example embodiments, the anisotropic conductive material according to example embodiments may be applied not only to the device of FIG. 17 but also to various other devices. For example, in example embodiments, the anisotropic conductive material may be applied to various bonding methods such as chip-on-glass (COG) bonding, chip-on-board (COB) bonding, chip-on-film (COF) bonding, and tape-automated bonding (TAB). Also, in example embodiments, the anisotropic conductive material may be applied to various fields such as a process for bonding an integrated circuit (IC) to a liquid crystal display (LCD), a process for bonding a printed circuit board (PCB) to an IC, a process for bonding a flexible printed circuit (FPC) to an IC, a process for bonding an FPC to a plasma display panel (PDP), a process for bonding a tape carrier package (TCP) to an LCD, a process for bonding a TCP to a PCB, a process for bonding an FPC to an LCD, and a process for bonding an FPC to a PCB. Also, in example embodiments, the anisotropic conductive material may be applied to fields such as plasma displays and flip chip packages. The anisotropic conductive material according to example embodiments may be applied to any field to which the anisotropic conductive film and the anisotropic conductive paste of the related art may be applied.

Figure 18:
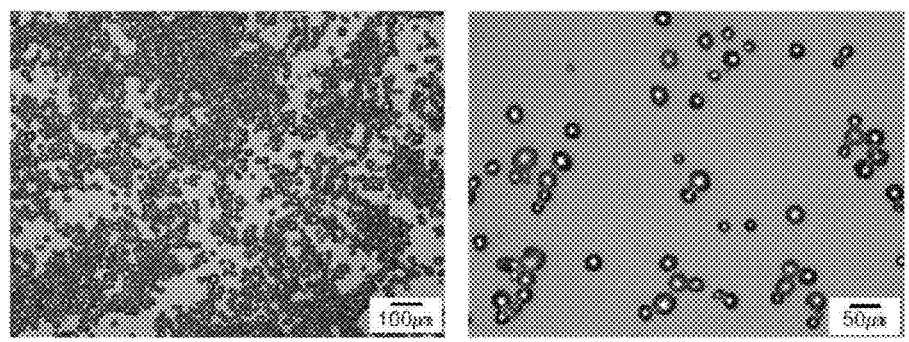
FIG. 18 is an optical microscope image illustrating a plurality of particles (capsules) formed according to example embodiments.

FIG. 18 is an optical microscope image illustrating a plurality of particles (capsules) formed according to example embodiments. The particle (capsule) of FIG. 18 may correspond to the particle 10 of FIG. 1.

Referring to FIG. 18, it may be seen that the particles (capsules) have a substantially-spherical shape or any similar shape and have a diameter (size) of less than tens of μm. The particle (capsule) may have a diameter (size) of about 1 μm to about 100 μm or about 5 μm to about 50 μm. The diameter (size) of the particle (capsule) may be controlled by the process conditions. A core portion of the particle (capsule) illustrated in FIG. 18 includes a liquid metal "Ga", and a shell portion thereof includes an insulating polymer.

Figure 19:
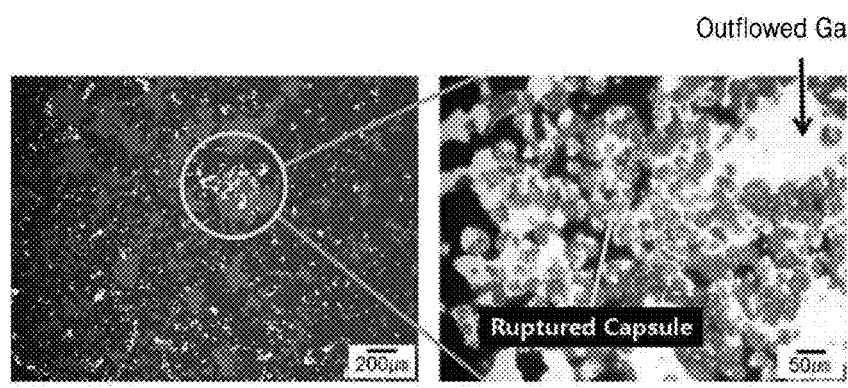
FIG. 19 is an optical microscope image illustrating a result obtained by artificially breaking some of the particles (capsules) of FIG. 18.

In order to check whether the liquid metal (Ga) is included in the core portion of the particle (capsule), the particle (capsule) was artificially broken by using a slide glass. The result thereof was the same as illustrated in FIG. 19 (the optical microscope image). Referring to FIG. 19, it may be seen that the liquid-state Ga is outflowed when the particle (capsule) is broken. A white portion in the right image of FIG. 19 corresponds to Ga.

Also, the particles (capsules) of FIG. 18 were dispersed into a polymer resin (epoxy resin), a blade coating method was used to coat a substrate with the polymer resin (epoxy resin) having the particles (capsules) dispersed therein, and then the resulting structure was dried. Accordingly, an anisotropic conductive film (ACF) including the particles (capsules) dispersed in the polymer resin was formed.

Figure 20:
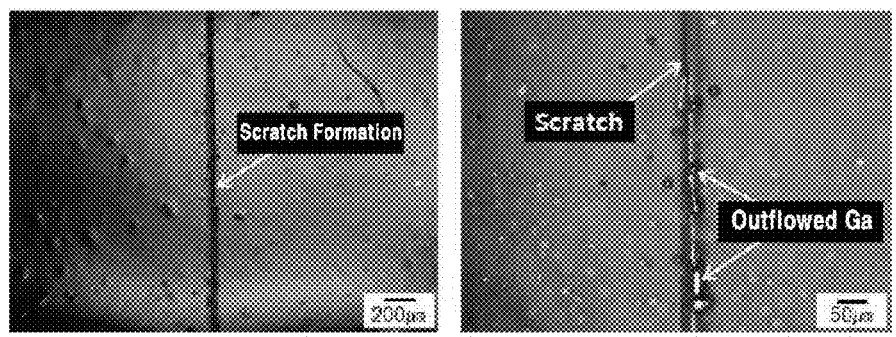
FIG. 20 is an optical microscope image illustrating a result obtained by artificially forming a scratch on an anisotropic conductive film formed according to example embodiments.

FIG. 20 is an optical microscope image illustrating a result obtained by artificially forming a scratch on the anisotropic conductive film (ACF) formed according to the above method. Referring to FIG. 20, it may be seen that when an artificial scratch is formed on the anisotropic conductive film (ACF), the particles (capsules) are broken by the scratch and thus the liquid metal (Ga) is outflowed therefrom.

Figure 21:
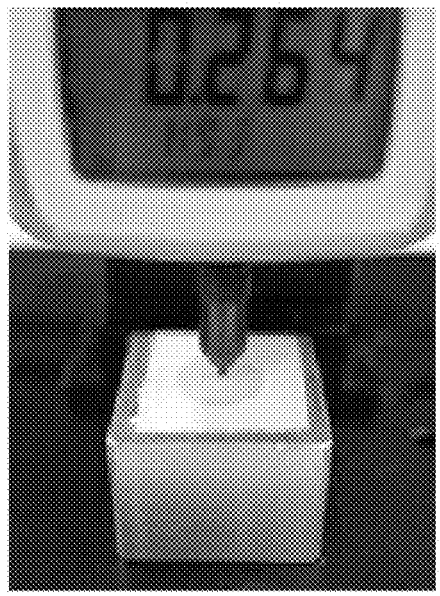
FIG. 21 is a picture illustrating a setup for measuring a breaking force of a particle (capsule) according to example embodiments.
Figure 22:
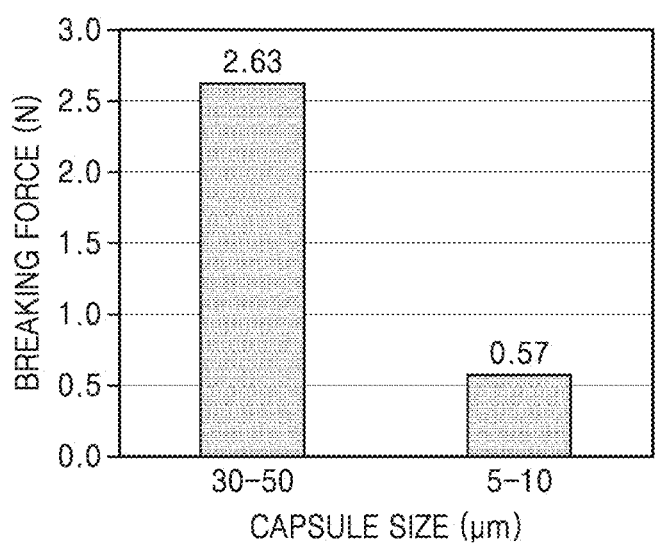
FIG. 22 is a graph illustrating a result of measuring a breaking force for each size of a particle (capsule) by using the setup of FIG. 21.

FIG. 21 illustrates a setup for measuring a breaking force of the particle (capsule) according to example embodiments. FIG. 22 illustrates the result of measuring a breaking force for each size of the particle (capsule) by using the setup of FIG. 21.

Referring to FIG. 21, after a plurality of particles (capsules) are loaded between two glasses, the breaking force of particles (capsules) is measured by a digital gauge while applying a pressure thereto. The measurement results thereof are illustrated in the graph of FIG. 22.

Referring to FIG. 22, when a plurality of particles (capsules) of a first group have a size of about 30 μm to about 50 μm, the breaking force thereof is about 2.63 N. When a plurality of particles (capsules) of a second group have a size of about 5 μm to about 10 μm, the breaking force thereof is about 0.57 N. The number of the particles (capsules) of the first group is equal to the number of the particles (capsules) of the second group. From this result, it may be seen that the breaking force decreases by about 77% when the size of the particle (capsule) decreases from about 30 μm to about 50 μm to about 5 μm to about 10 μm. It is expected that the breaking force decrease because the thickness of the shell portion decreases with the decrease of the particle (capsule) size.

Additionally, in example embodiments, the force used for breaking the particles (capsules) having a size of about 30 μm to about 50 μm was measured as about 2.63 N. In consideration of the area occupied by the particles (capsules), when this is converted in units of MPa, it is estimated as about 1 MPa or less. This may be a low pressure of at least about ⅕ or less in comparison with the pressure necessary for the bonding process based on the anisotropic conductive film (ACF) of the related art. Accordingly, it is expected that when the anisotropic conductive material (anisotropic conductive film) according to example embodiments is used, the pressure used for the bonding process may be reduced considerably in comparison with the related art.

Figure 23:
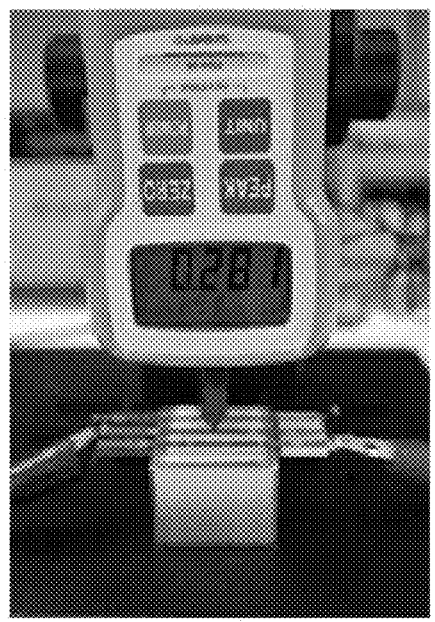
FIG. 23 is a picture illustrating a setup for a current-flowing experiment based on a particle (capsule) breaking according to example embodiments.
Figure 24:
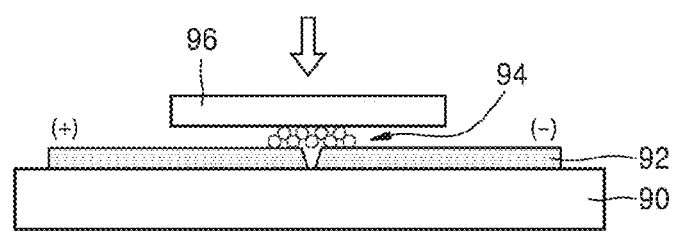
FIG. 24 is a schematic diagram illustrating the setup of FIG. 23 in detail.
Figure 25:
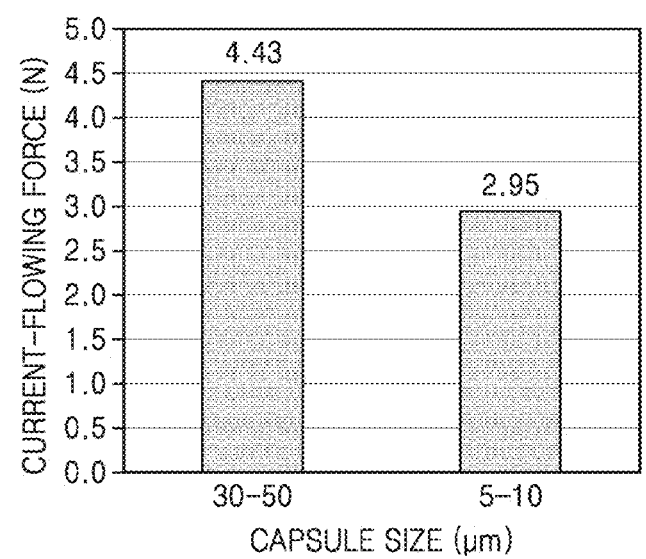
FIG. 25 is a graph illustrating a result of measuring a current-flowing force for each size of a particle (capsule) by using the setup of FIG. 23.

FIG. 23 illustrates a setup for a current-flowing experiment based on the break of the particle (capsule) according to example embodiments. FIG. 24 is a schematic diagram illustrating the setup of FIG. 23 in detail. FIG. 25 illustrates the result of measuring a current-flowing force for each size of the particle (capsule) by using the setup of FIG. 23.

Referring to FIGS. 23 and 24, a disconnected Cu interconnection line 92 is disposed on a glass substrate 90, a plurality of particles (capsules) 94 are loaded on the disconnected portion of the Cu interconnection line 92, an upper glass 96 is disposed thereon, and the force (strength) necessary for flowing a current through the Cu interconnection line 92 by breaking the particle (capsule) is measured while applying a pressure thereon. The measurement results thereof are illustrated in the graph of FIG. 25.

Referring to FIG. 25, when a plurality of particles (capsules) of a first group have a size of about 30 μm to about 50 μm, the current-flowing force thereof is about 4.43 N. When a plurality of particles (capsules) of a second group have a size of about 5 μm to about 10 μm, the current-flowing force thereof is about 2.95 N. The number of the particles (capsules) of the first group is equal to the number of the particles (capsules) of the second group. From this result, it may be seen that the current-flowing force decreases by about 34% when the size of the particle (capsule) decreases from about 30 μm to about 50 μm to about 5 μm to about 10 μm. Since a conductive material is outflowed by the break of the particle (capsule), an electrical connection therebetween may be formed through the outflowed conductive material. Also, as the size of the particle (capsule) decreases, the breaking force for the electrical connection may decrease.

Although many details have been described above, they are not intended to limit the scope of inventive concepts, but should be interpreted as non-limiting examples. For example, those of ordinary skill in the art will understand that the configurations of the anisotropic conductive materials A10, A10', and A11 described with reference to FIGS. 1 to 6 may vary according to example embodiments. Also, those of ordinary skill in the art will understand that the anisotropic conductive material manufacturing method described with reference to FIGS. 7A to 7E may vary according to example embodiments. Also, those of ordinary skill in the art will understand that the electronic device including the anisotropic conductive material and the electronic device manufacturing method described with reference to FIGS. 8A to 8C, 9, 10, 16, and 17 may vary according to example embodiments. For example, those of ordinary skill in the art will understand that the anisotropic conductive material according to example embodiments may be used not only in the display device of FIG. 17 but also in various semiconductor device mounting technologies and may also be applied to the field of chip-to-chip connection in some cases. Therefore, the scope of inventive concepts should be defined not by only the example embodiments herein but by the technical spirit and scope described in the following claims.

It should be understood that example embodiments described herein should be considered in a descriptive sense only and not for purposes of limitation. Descriptions of features or aspects within each one of the example embodiments should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An anisotropic conductive material comprising:
a matrix material layer; and
a plurality of particles in the matrix material layer, at least some of the particles having a capsule structure including a conductive core portion and an insulating shell portion,
the conductive core portion including a conductive material that is in a liquid state at a temperature greater than about 15° C. and less than or equal to about 110° C., wherein
the insulating shell portion includes a polymer or a ceramic, and
the polymer has an elastic modulus of about 0.3 GN/m$^2$ to about 35 GN/m$^2$.

2. The anisotropic conductive material of claim 1, wherein the conductive material includes a liquid metal.

3. The anisotropic conductive material of claim 2, wherein the liquid metal includes at least one of gallium (Ga), a gallium-indium (Ga—In) alloy, a gallium-indium-tin (Ga—In—Sn) alloy, and a gallium-indium-tin-zinc (Ga—In—Sn—Zn) alloy.

4. The anisotropic conductive material of claim 2, wherein the conductive material further includes nanofillers contained in the liquid metal.

5. The anisotropic conductive material of claim 4, wherein the nanofillers includes at least one of a carbon nanotube (CNT), a carbon nanofiber (CNF), a carbon black, a fullerene, a graphene flake, a graphene particle, a metal nanowire, and a metal nanoparticle.

6. The anisotropic conductive material of claim 1, wherein the conductive material includes a suspension containing nanofillers.

7. The anisotropic conductive material of claim 6, wherein the nanofillers include at least one of a carbon nanotube (CNT), a carbon nanofiber (CNF), a carbon black, a fullerene, a graphene flake, a graphene particle, a metal nanowire, and a metal nanoparticle.

8. The anisotropic conductive material of claim 1, wherein the conductive material includes a solder having a melting point of about 110° C. or less.

9. The anisotropic conductive material of claim 8, wherein the solder includes at least one of a bismuth-indium (Bi—In)-based alloy, a bismuth-tin (Bi—Sn)-based alloy, an indium-bismuth (In—Bi)-based alloy, a bismuth-indium-tin (Bi—In—Sn)-based alloy, an indium-bismuth-tin (In—Bi—Sn)-based alloy, and an indium-tin-zinc (In—Sn—Zn)-based alloy.

10. The anisotropic conductive material of claim 1, wherein the insulating shell portion has a thickness of about 30 nm to about 200 nm.

11. The anisotropic conductive material of claim 1, wherein the particles have a diameter of about 1 μm to about 100 μm.

12. The anisotropic conductive material of claim 1, further comprising: at least one self-healing capsule in the matrix material layer.

13. The anisotropic conductive material of claim 12, wherein the self-healing capsule includes an underfill material.

14. An electronic device comprising:
the anisotropic conductive material of claim 1;
a first member;
a second member;
a structure electrically connecting the first member the second member using the anisotropic conductive material.

15. An electronic device comprising:
a first member including at least one first electrode portion;

a second member including at least one second electrode portion, the second member facing the first member; and the anisotropic conductive material of claim 1 between the first member and the second member, the insulating shell portion of at least one of the particles being broken between the first electrode portion and the second electrode portion such that the insulating shell portion forms a broken shell portion and the conductive core portion forms an outflowed core portion that is outflowed to an outside of the broken shell portion, and the first electrode portion and the second electrode portion are electrically connected by the outflowed core portion.

16. The electronic device of claim 15, wherein the conductive material includes a liquid metal.

17. The electronic device of claim 16, wherein the conductive material further includes nanofillers contained in the liquid metal.

18. The electronic device of claim 15, wherein the conductive material includes a suspension containing nanofillers.

19. The electronic device of claim 17, wherein the nanofillers include at least one of a carbon nanotube (CNT), a carbon nanofiber (CNF), a carbon black, a fullerene, a graphene flake, a graphene particle, a metal nanowire, and a metal nanoparticle.

20. The electronic device of claim 15, wherein the conductive material includes a solder having a melting point of about 110° C. or less.

21. The electronic device of claim 15, further comprising:
an intermetallic compound, wherein
the intermetallic compound is between at least one of
the first electrode portion and the outflowed core portion, and
the second electrode portion and the outflowed core portion.

22. The electronic device of claim 15, wherein
the insulating shell portion includes a polymer or a ceramic, and
the polymer has an elastic modulus of about 0.3 $GN/m^2$ to about 35 $GN/m^2$.

23. The electronic device of claim 15, wherein the insulating shell portion has a thickness of about 30 nm to about 200 nm.

24. The electronic device of claim 15, wherein the particles have a diameter of about 1 μm to about 100 μm.

25. The electronic device of claim 15, wherein the anisotropic conductive material further includes at least one self-healing capsule.

26. The electronic device of claim 15, wherein
the first member includes a substrate, and
the second member includes a semiconductor chip.

27. The electronic device of claim 15, wherein
the first member includes a substrate or a panel, and
the second member includes a driver integrated circuit (IC) or a driver IC package.

28. The electronic device of claim 15, wherein the electronic device includes a display device.

29. An electronic device comprising:
a first member including at least one first electrode portion;
a second member including at least one second electrode portion, the second member facing the first member; and
the anisotropic conductive material of claim 1 between the first member and the second member, the anisotropic conductive material electrically connecting the first electrode portion to the second electrode portion,
the conductive core portion of the anisotropic conductive material including a metallic material,
the metallic material being between the first electrode portion and the second electrode portion; and
an intermetallic compound between the metallic material and at least one of the first electrode portion and the second electrode portion.

30. The electronic device of claim 29, wherein
the insulating shell portion of at least one of the particles is broken between the first electrode portion and the second electrode portion such that the insulating shell portion forms a broken shell portion and the conductive core portion forms an outflowed core portion that is outflowed to an outside of the broken shell portion, and the first electrode portion and the second electrode portion are electrically connected by the outflowed core portion,
the outflowed core portion includes the metallic material, and
the intermetallic compound is between the outflowed core portion and at least one of the first electrode portion and the second electrode portion.

* * * * *